US011495318B2

(12) United States Patent
Chien

(10) Patent No.: US 11,495,318 B2
(45) Date of Patent: Nov. 8, 2022

(54) MEMORY DEVICE AND METHOD FOR USING SHARED LATCH ELEMENTS THEREOF

(71) Applicant: NANYA TECHNOLOGY CORPORATION, New Taipei (TW)

(72) Inventor: Jung-Hsing Chien, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 205 days.

(21) Appl. No.: 16/891,326

(22) Filed: Jun. 3, 2020

(65) Prior Publication Data

US 2021/0383885 A1 Dec. 9, 2021

(51) Int. Cl.
| | | |
|---|---|---|
| G11C 29/38 | (2006.01) | |
| G11C 29/36 | (2006.01) | |
| H01L 25/065 | (2006.01) | |
| H01L 25/18 | (2006.01) | |
| G01R 31/3177 | (2006.01) | |
| G11C 29/50 | (2006.01) | |

(52) U.S. Cl.
CPC .......... *G11C 29/38* (2013.01); *G01R 31/3177* (2013.01); *G11C 29/36* (2013.01); *H01L 25/0657* (2013.01); *H01L 25/18* (2013.01); *H01L 2225/06541* (2013.01)

(58) Field of Classification Search
None
See application file for complete search history.

(56) References Cited

U.S. PATENT DOCUMENTS

| | | | | |
|---|---|---|---|---|
| 2003/0074611 A1* | 4/2003 | Nachumovsky | ..... | G11C 29/006 714/718 |
| 2003/0237031 A1* | 12/2003 | Hung | ..... | G11C 29/44 714/718 |
| 2004/0042293 A1* | 3/2004 | Ogino | ..... | G11C 29/72 365/202 |
| 2008/0209283 A1* | 8/2008 | Gupta | ..... | G11C 29/4401 365/201 |
| 2013/0036255 A1* | 2/2013 | Fai | ..... | G11C 29/08 711/E12.008 |
| 2016/0225465 A1* | 8/2016 | Qian | ..... | G11C 29/48 |
| 2020/0335143 A1* | 10/2020 | Ajima | ..... | G11C 29/44 |

* cited by examiner

*Primary Examiner* — April Y Blair
*Assistant Examiner* — Dipakkumar B Gandhi
(74) *Attorney, Agent, or Firm* — Muncy, Geissler, Olds & Lowe, P.C.

(57) ABSTRACT

The present disclosure provides memory devices and methods for using shared latch elements thereof. A memory device includes a substrate, an interposer disposed over the substrate, and a logic die and stacked memory dies disposed over the interposer. In the logic die, the test generation module performs a memory test operation for the memory device. The functional elements stores functional data in latch elements during a functional mode of the memory device. The repair analysis module determines memory test/repair data based on the memory test operation. The memory test/repair data comprises memory addresses of faulty memory storage locations of the memory device that are identified during the memory test operation. The repair analysis module configures the latch elements into a scan chain, accesses the memory test/repair data during the test mode of the memory device, and repairs the memory device using the memory test/repair data.

18 Claims, 10 Drawing Sheets

MEMORY DEVICE AND METHOD FOR USING SHARED LATCH ELEMENTS THEREOF

TECHNICAL FIELD

The present disclosure relates to memory devices, and more particularly, to three-dimensional (3D) memory devices and methods for using shared latch elements thereof.

DISCUSSION OF THE BACKGROUND

The growth of the semiconductor industry has led to the drastic increase in the capacity and density of memory devices. Memory built-in self-test (BIST) techniques are often used by memory devices. In these BIST techniques, some or all of the memory storage locations are analyzed by embedded circuitry to identify faulty memory storage locations. Repair information, such as the addresses of the faulty memory storage locations, is stored in a set of latches dedicated only to the storage of test information. The repair information can then be retrieved from these dedicated latches for the purpose of repairing the faulty memory storage locations, such as by rerouting the corresponding address to a back-up memory storage location. The number of dedicated latches for storing the test information rises as the capacity of memory devices increases. However, this increase in the number of dedicated latches for storing memory test information has resulted in added size, complexity, and cost of conventional memory devices. Therefore, memory device architectures and methods for reducing the number of dedicated latches are needed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a memory device, comprising a substrate, an interposer disposed over the substrate, a logic die disposed over the interposer, and a plurality of stacked dynamic random access memory (DRAM) dies disposed over the interposer. The logic die comprises a test generation module, a plurality of functional elements, a repair analysis module, and a memory address storage module. The test generation module performs a memory test operation for the memory device. The plurality of functional elements comprises a plurality of latch elements, and the plurality of functional elements stores functional data in the plurality of latch elements during a functional mode of the memory device. The repair analysis module determines memory test/repair data based on the memory test operation. The memory test/repair data comprises a series of bits representing a serial list of memory addresses of faulty memory storage locations of the memory device that are identified during the memory test operation. The memory address storage module stores the memory test/repair data at the plurality of latch elements during a test mode of the memory device. The memory address storage module comprises a plurality of outputs, each output mapped to an input of a corresponding latch element. Moreover, the memory address storage module stores the memory test/repair data by storing, in parallel, each bit of the memory test/repair data to a corresponding latch element via a corresponding output of the plurality of outputs. The repair analysis module configures the plurality of latch elements into a scan chain, uses the scan chain to access the memory test/repair data during the test mode of the memory device, and repairs the memory device using the memory test/repair data accessed from the scan chain.

In some embodiments, the memory device further comprises a memory array to route memory addresses associated with the faulty memory storage locations to alternate memory storage locations.

In some embodiments, the memory device further comprises an external test port coupled to the plurality of latch elements, wherein the memory device configures the plurality of latch elements into a scan chain and scan out the memory test/repair data to an external device via the external test port.

In some embodiments, the memory device further comprises a fuse controller, wherein the memory array reroutes the memory addresses associated with the faulty memory storage locations further based on fuse states of the fuse controller.

In some embodiments, the memory address storage module stores the memory test/repair data by configuring the plurality of latch elements into a scan chain and scanning the memory test/repair data into the scan chain.

In some embodiments, each latch element of the plurality of latch elements comprises: a first input configured to receive a corresponding functional data bit of the functional data; a second input configured to receive a corresponding memory test/repair data bit of the memory test/repair data; a latch comprising a data input and a data output; and select logic configured to selectively connect one of the first input or the second input to the data input of the latch based on a mode of operation of the memory device.

In some embodiments, the plurality of latch elements is configurable into a scan chain, and wherein each latch element of a subset of the plurality of latch element further comprises a third input coupled to the data output of the latch of a previous latch element in the scan chain; and wherein the select logic is configured to selectively connect one of the first input, the second input, or the third input to the data input of the latch based on the mode of operation of the memory device.

In some embodiments, the select logic comprises: a first multiplexer comprising an input configured to receive a first control signal, an input coupled to the second input, an input coupled to the third input, and an output; and a second multiplexer comprising an input configured to receive a second control signal, an input coupled to the output of the first multiplexer, an input coupled to the first input, and an output coupled to the data input of the latch.

In some embodiments, the first control signal is based on a state of the scan chain; and the second control signal is based on the state of the scan chain and the mode of operation of the memory device.

In some embodiments, the select logic comprises a multiplexer comprising an input configured to receive a control signal, an input coupled to the first input, an input coupled to the second input, and an output.

In some embodiments, the plurality of stacked DRAM dies are disposed over the logic die.

Another aspect of the present disclosure provides a method, comprising: providing a memory device comprising a substrate, an interposer disposed over the substrate, and a logic die and a plurality of stacked dynamic random access memory (DRAM) dies disposed over the interposer, the logic die comprising a plurality of functional elements, the plurality of functional elements comprising a plurality of latch elements; in a first mode, performing one or more functional operations using the functional elements and storing functional data associated with the one or more functional operations at the plurality of latch elements; in a second mode: performing a memory test operation for the memory device to determine memory test/repair data, the memory test/repair data comprising a series of bits representing a serial list of memory addresses of faulty memory storage locations of the memory device that are identified during the memory test operation; and storing, in parallel, each bit of the memory test/repair data at a corresponding latch element of the plurality of latch elements; configuring the plurality of latch elements into a scan chain and using the scan chain to access the memory test/repair data; and repairing the memory device using the memory test/repair data accessed from the scan chain.

In some embodiments, repairing the memory device using the memory test/repair data comprises rerouting memory addresses associated with the faulty memory storage locations to alternate memory storage locations.

In some embodiments, repairing the memory device further comprises repairing the memory device using a fuse controller of the memory device.

In some embodiments, the method further comprises configuring the plurality of latch elements into a scan chain and scanning out the memory test/repair data to an external device via an external test port of the memory device.

In some embodiments, storing the memory test/repair data at the plurality of latch elements comprises: configuring the plurality of latch elements into a scan chain; and scanning the memory test/repair data into the scan chain.

In some embodiments, storing the memory test/repair data at the plurality of latch elements comprises configuring the plurality of latch elements to store the memory test/repair data in response to a control signal having a first state.

In some embodiments, storing the functional data at the plurality of latch elements comprises configuring the plurality of latch elements to store the functional data in response to the control signal having a second state.

In some embodiments, the method further comprises accessing the memory test/repair data from the plurality of latch elements via an external test port.

In some embodiments, the plurality of stacked DRAM dies are disposed over the logic die.

Accordingly, the three-dimensional (3D) memory devices and the methods of the present disclosure utilize bimodal shared latch elements to store either memory test/repair data related to a memory test operation or functional data related to a functional operation, depending on a mode of the memory device. Thus, latch elements used for functional operations that would otherwise be idle during memory test operations can be reused for memory test operations, and also vice versa, thus requiring fewer latch elements than a conventional memory architecture having latches dedicated to storing only memory test information. Moreover, the size of the entire package can be further minimized with device integration, and therefore the 3D memory devices and the methods of the present disclosure have enhanced performance and product yield due to reduced transmission delays and the flexibility of the shared latch elements in the memory test/repair and functional operations of the logic dies in the 3D memory devices. Moreover, the manufacturing costs of the 3D memory devices in the present disclosure should also be lower than the conventional memory architecture.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
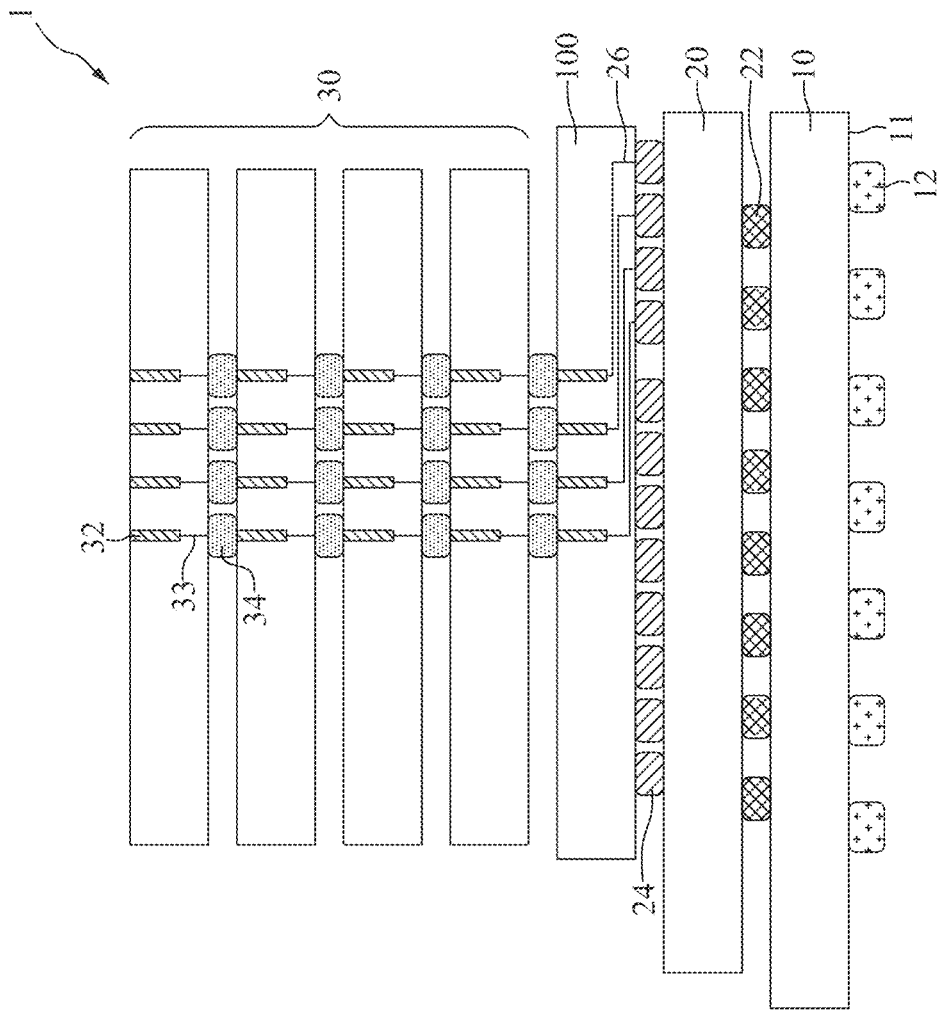
FIG. 1 is a schematic view of a memory device according to some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof. The terms "including", "having", or any variation thereof, as used herein, are defined as comprising.

As used herein, the term "another", is defined as at least a second or more. The term "coupled", as used herein with reference to electro-optical technology, is defined as connected, although not necessarily directly, and not necessarily mechanically. The terms "set" or "assert" and "negate" (or "deassert" or "clear") are used when referring to the rendering of a signal, status bit, or similar apparatus into its logically true or logically false state, respectively. If the logically true state is a logic level one, the logically false state is a logic level zero. On the other hand, if the logically true state is a logic level zero, the logically false state is a logic level one.

The term "bus" used herein is for reference to a plurality of signals or conductors that may be used to transfer one or more various types of information, such as status, data, addresses, or control. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals in a time multiplexed manner or serially. Likewise, single conductors carrying multiple signals may be separated out into various different conductors carrying subsets of these signals, as many options exist for transferring signals.

As used herein, the term "functional operation" and its variants, as used herein, refer to an operation of a memory device other than the purpose of identifying one or more faulty, or potentially faulty, memory storage locations of the memory device. The term "functional data" and its variants used herein refer to data generated by, or otherwise associated with, a functional operation. The term "memory test operation" and its variants used herein refer to an operation of a memory device for the purpose of identifying one or more faulty, or potentially faulty, memory storage locations of a memory device. The term "memory test/repair data" and its variants used herein refer to data generated by, or otherwise associated with, a memory test operation, a memory repair operation, or a combination thereof.

Various figures of the present disclosure illustrate example techniques for storing memory test information for use in, for example, repairing failing memory devices. In at least one embodiment, one or more bimodal shared latch elements are used to store either memory test/repair data related to a memory test operation or functional data related to a functional operation, depending on a mode of the memory device. Thus, latch elements used for functional operations that would otherwise be idle during memory test operations can be reused for memory test operations, and also vice versa, thus requiring fewer latch elements than a conventional memory architecture having latches dedicated to storing only memory test information.

FIG. 1 is a schematic view of a memory device 1 according to some embodiments of the present disclosure. With reference to FIG. 1, the memory device 1, which may be a three-dimensional (3D) memory device, includes a substrate 10, an interposer 20 disposed over the substrate 10, a logic die 100 disposed over the interposer 20, and a plurality of stacked dynamic random access memory (DRAM) dies 30 disposed over the interposer 20. In some embodiments, the stacked DRAM dies 30 are disposed over the logic die 100. The stacked DRAM dies 30 and the logic die 100 are connected to each other via a combination of through-substrate vias (TSVs) 32, wirings 33, and first microbumps 34, as shown in FIG. 1. A plurality of second microbumps 22 are disposed between the substrate 10 and the interposer 20, and a plurality of third microbumps 24 are disposed between the interposer 20 and the logic die 100. In some embodiments, the logic die 100, which may also serve as a channel controller of the memory device 1, is connected to the third microbumps 24 on the interposer 20 via one or more traces 26. The second microbumps 22 on the substrate 10 may be connected to the third microbumps 24 on the interposer 20 by vias or other types of wirings (not shown). A plurality of solder bumps 12 may be disposed on a surface 11 of the substrate 10 opposite of the second microbumps 22. In some embodiments, the solder bumps 12 may be connected to wiring of a system board, such as a memory module circuit board, so as to connect the memory device 1 with external devices (not shown).

In some embodiments, the 3D memory device 1 may be configured as a wide input/output (I/O) and high-bandwidth memory (HBM) 3D memory device. The substrate 10 may be, for example, a package substrate, a printed circuit board (PCB) (e.g., FR4, polyimide, FR4, etc.) or another type of substrate. The TSVs 32 comprise through-substrate vias in each of the stacked DRAM dies 30 and the logic die 100, and are connected to form nodes. Each of the TSVs 32 comprises a via penetrating through at least the substrate of the dies and may penetrate through the entire die. When the TSVs 32 penetrate through the substrate but not through the entire die, the die may also include wiring (e.g. wiring 33) connecting the TSVs 32 to a chip pad or terminal (not shown) on the top surface of the die. The TSVs 32 may be through silicon vias when the substrate is silicon (e.g., formed from a crystalline silicon wafer on and/or in which internal circuitry is formed by semiconductor processing). The TSVs 32 may also be formed by other substrates used in semiconductor chip manufacturing, such as germanium, silicon-germanium, gallium-arsenic (GaAs), silicon-on-insulator, and the like. Although four sets of TSVs 32 are shown in FIG. 1, this is done for simplicity and other quantities of the TSVs 32 may be configured based on the application of the memory device 1. In some embodiments, the TSVs 32 may include one or more of a data through electrode, a command through electrode, an address through electrode, a power supply through electrode, a ground through electrode, and the like. In some embodiments, the interposer 20 may also comprise silicon, germanium, GaAs, silicon-on-insulator, and the like.

Figure 2:
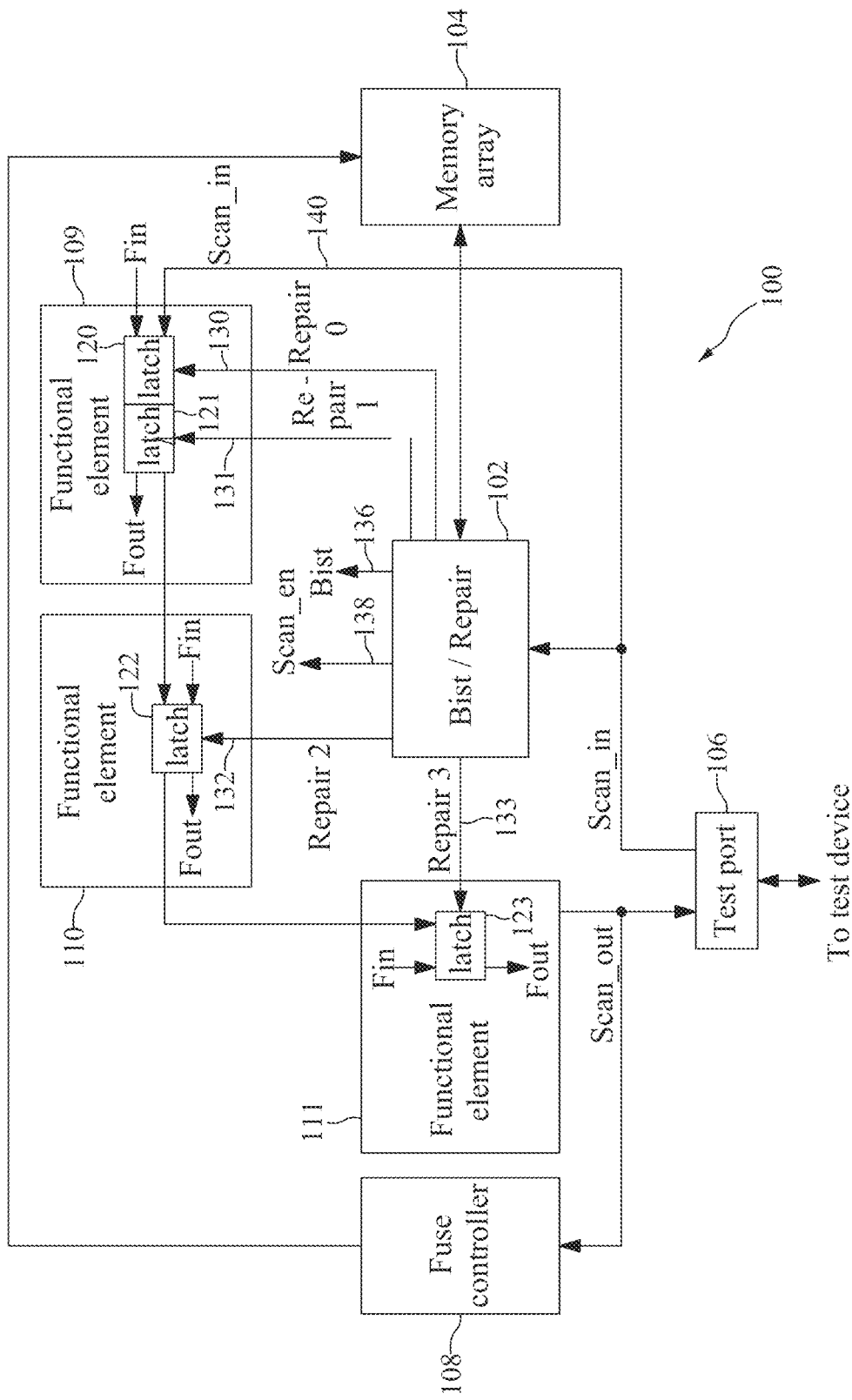
FIG. 2 is a block diagram of a logic die in a memory device according to some embodiments of the present disclosure.

FIG. 2 is a block diagram of the logic die 100 in the memory device 1 according to some embodiments of the present disclosure. With reference to FIG. 2, the logic die 100 includes a built-in self-test (BIST)/repair module 102, a memory array 104, a test port 106, a fuse controller 108, and a plurality of functional elements 109, 110, and 111 (functional elements 109-111).

In some embodiments, the memory array 104 (e.g., stacked DRAM dies 30) may include a plurality of memory storage locations arranged in, for example, a matrix of rows and columns accessed via row and column drivers (not shown). The test port 106 may include any of a variety of test ports utilized by an external test device, such as a test port substantially compliant with the Institute of Electrical and Electronic Engineers (IEEE) 1149.1 standard, also known as the Standard Test Access Port and Boundary-Scan Architecture or the JTAG standard, for example. The fuse controller 108 may include any of a variety of fuse mechanisms known in the art, such as a fuse array, for rerouting memory addresses mapped to a faulty memory storage location to an alternate storage location. In some embodiments, the fuse controller 108 includes a processor and related circuitry that selects fuses to blow so as to reroute from faulty memory locations. In alternate embodiments, select fuses can be blown manually to repair the memory based on the test/repair data.

In some embodiments, the functional elements 109-111 may include any of a variety of logic-based functional elements to implement functional operations of the logic die 100 in the memory device 1. Examples of the functional elements 109-111 may include, for example, adders, multipliers, encoders, decoders, and the like. Each of the functional elements 109-111 may include one or more bimodal latch elements configurable to store either functional data associated with a functional operation performed at the corresponding functional element, or memory test/repair data associated with a memory test operation performed at the logic die 100 in the memory device 1. In some embodiments, the bimodal latch elements are configurable to form at least part of one or more scan chains accessible via, for example, the test port 106. In the illustrated example shown in FIG. 2, the functional element 109 includes a bimodal latch element 120 and a bimodal latch element 121, the functional component 110 includes a bimodal latch element 122, and the functional component 111 includes a bimodal latch element 123. As illustrated in greater detail herein, in some embodiments, each of the bimodal latch elements 120, 121, 122, and 123 ("bimodal latch element 120-123") includes an input (FIN) to receive functional data, an output (FOUT) to provide latched functional data, and an input configured to receive memory test/repair data (illustrated as signals 130, 131, 132, and 133, respectively). Each of the bimodal latch elements 120-123 may also include an input connectable to the previous stage of a scan chain and an output connectable to the next stage of the scan chain. For example, as shown in FIG. 2, the bimodal latch elements 120-123 may be connected in sequence to form a scan chain accessible via the test port 106, whereby a scan chain input signal (SCAN_IN signal 140) and a scan chain output signal (SCAN_OUT signal 142) can be communicated with an external test device via the test port 106 or via the BIST/repair module 102. Alternately, in some embodiments, the bimodal latch elements 120-123 may be mapped for access via the test port 106. Each of the bimodal latch elements 120-123 may further include inputs to receive control signals, such as a BIST signal 136 and a SCAN_EN signal 138, to configure a mode of the bimodal latch element. It should be noted that, although a relatively small number of bimodal latch elements are illustrated for purposes of clarity, it will be appreciated by those skilled in the arts that hundreds, thousands, or millions of bimodal latch elements may be used in a device implementation.

In some embodiments, when in a memory test mode, the BIST/repair module 102, is configured to perform a memory test operation to test some or all of the memory storage locations of the memory array 104 to identify those memory storage locations that are faulty (or likely faulty). The BIST/repair module 102 may be configured to perform any of a variety of memory test methods known to those skilled in the art, such as a read/write recovery test, a checkerboard test, a walking bit test, and the like. The BIST/repair module 102 may also configure the relevant control signals, e.g., the BIST signal 136 and the SCAN_EN signal 138, to configure the bimodal latch elements 120-123 for the memory test mode. In some embodiments, the BIST signal 136 represents whether the logic die 100 in the memory device 1 is in a memory test mode or a functional mode, and the SCAN_EN signal 138 represents whether the bimodal latch elements 120-123 are configured to operate as a scan chain.

In some embodiments, as the memory test operation progresses, information generated from the memory test operation is stored at the bimodal latch elements 120-123 as memory test/repair data. The memory test/repair data may include, for example, a series of bits representing a serial list of the memory addresses of faulty memory storage locations identified by the BIST/repair module 102. Other formats of the memory test/repair data may be utilized without departing from the scope of the present disclosure.

In some embodiments, the BIST/repair module 102 includes an output mapped to each bimodal latch element and a bit of the memory test/repair data is stored to a bimodal latch via the corresponding output of the BIST/repair module 102. To illustrate using the example shown in FIG. 2, the BIST/repair module 102 includes repair signals 130, 131, 132, and 133 connected to bimodal latch elements 120-123, respectively, whereby the BIST/repair module 102 stores one bit of the memory test/repair data to the bimodal latch element 120 via the repair signal 130, the next bit of the memory test/repair data to the bimodal latch element 121 via the repair signal 131, the third bit of the memory test/repair data to the bimodal latch element 122 via the repair signal 132, and the fourth bit of the memory test/repair data to the bimodal latch element 123 via the repair signal 133. In alternate embodiments, the BIST/repair module 102 includes an output through which the BIST/repair module 102 can scan the memory test/repair data into the scan chain formed by the bimodal latch elements 120-123.

In some embodiments, when the logic die 100 in the memory device 1 is in a functional mode, the BIST/repair module 102 configures the control signals, e.g., the BIST signal 136 and the SCAN_EN signal 138, so as to configure the bimodal latch elements 120-123 to store functional data generated as a result of the functional operations performed by the functional elements 109-111. The functional data (e.g., a bit) to be stored at a bimodal latch element is received via its functional input (FIN), which is connected to other functional circuitry of the same functional element or other functional elements. Similarly, the functional data latched at the bimodal latch element is provided via its functional output (FOUT), which is connected to other functional circuitry of the same functional element or other functional elements.

As shown in FIG. 2, latch elements that otherwise would be idle during a memory test mode are used to store memory test/repair data, and this facilitates the implementation of fewer latch elements at the memory device 1 compared to memory devices that utilize latch elements dedicated to storing functional data only and separate latch elements dedicated to storing memory test/repair data only.

Figure 3:
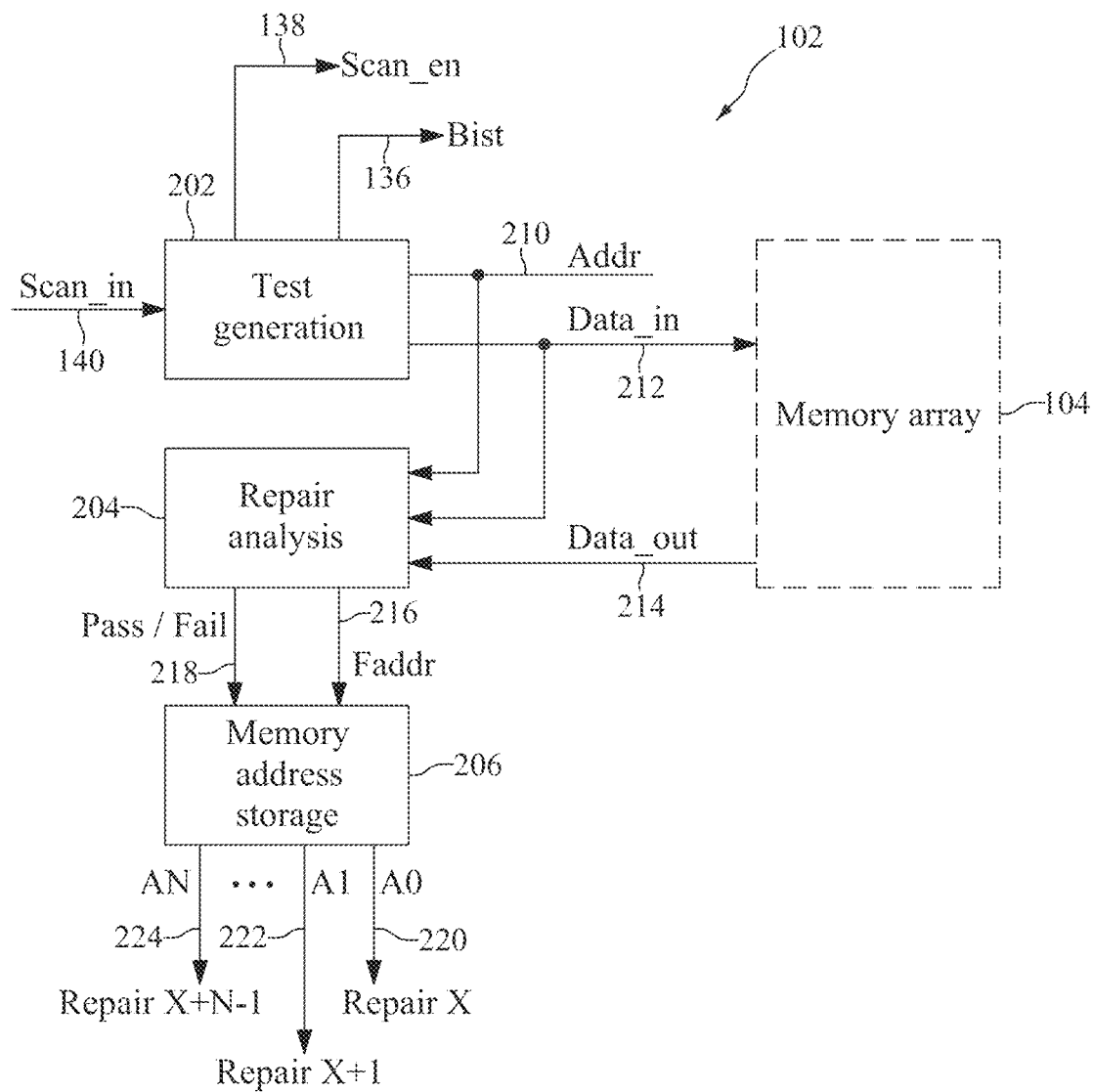
FIG. 3 is a block diagram of a built-in self-test (BIST)/repair module of a logic die according to some embodiments of the present disclosure.

FIG. 3 is a block diagram of the BIST/repair module 102 of the logic die 100 according to some embodiments of the present disclosure. With reference to FIG. 3, the BIST/repair module 102 includes a test generation module 202, a repair analysis module 204, and a memory address storage module 206. In some embodiments, the modules 202, 204, and 206 are implemented as logic circuitry implemented at, or associated with, the memory device 1. In some embodiments, the test generation module 202 includes outputs to provide the BIST signal 136 and the SCAN_EN signal 138, an output connected to the memory array 104 (e.g., connected to an input of a row/column driver) to provide a memory address (ADDR) value 210, and an output connected to the memory array 104 (e.g., the stacked DRAM dies 30) to provide an input data (DATA_IN) value 212. The repair analysis module 204 includes an input to receive the ADDR value 210, an input to receive the DATA_IN value 212, and an input to receive an output data value (DATA_OUT) value 214, which may be the same as, or different from, the DATA_IN value 212 depending on whether the memory storage location is faulty. The repair analysis module 204 further includes an output to provide an address value for a faulty memory storage location (FADDR value 216), and an output to provide a PASS/FAIL indicator 218 that serves to indicate whether the memory storage location tested is faulty or not. The memory address storage module 206 includes inputs to receive the FADDR value 216 and the PASS/FAIL indicator 218, and a plurality of outputs, each output coupled to a corresponding bimodal latch element (e.g., bimodal latch elements 109-111) of the logic die 100 in the memory device 1. Alternately, in some embodiments, the memory address storage module 206 includes an output coupled to the initial bimodal latch element of a scan chain of bimodal latch elements.

In some embodiments, when in a memory test mode, the BIST/repair module 102 performs a memory test operation whereby each memory storage location of at least a portion of the memory array 104 is tested by writing a test value (DATA_IN value 212) to the memory storage location and then reading the memory storage location to verify that the value read from the memory storage location (DATA_OUT value 214) is the same as the value written to the storage location. As part of the memory test operation for a given memory storage location, the test generation module 202, in some embodiments, is configured to write the DATA_IN value 212 to the memory storage location of the memory array 104 associated with ADDR value 210. The repair analysis module 204 then accesses the memory storage location of the memory array and reads the DATA_OUT value 214 from the memory storage location. In the event that the DATA_IN value 212 and the DATA_OUT value 214 do not match (i.e., the memory storage location is faulty), the repair analysis module 204 provides a portion or all of the ADDR value 210 as the FADDR value 216 and places the PASS/FAIL indicator 218 in a first state (e.g., an asserted state), thereby indicating that the memory storage location associated with the FADDR value 216 is faulty. Otherwise, if the DATA_OUT value 214 matches the DATA_IN value 212 (i.e., the memory storage location is presumed reliable), the repair analysis module 204 places the PASS/FAIL indicator 218 in a second state (e.g., a de-asserted state), thereby indicating the memory storage location is not faulty. In response to the PASS/FAIL indicator 218 having the first state, the memory address storage module 206 latches the FADDR value 216. The memory address storage module 206 then distributes each bit of at least a portion of the FADDR value 216 to a corresponding bimodal latch element for storage. In some embodiments, each of the bits of the FADDR value 216 may be individually distributed via, for example, a mapping from the memory address storage module 206, or the bits may be distributed in sequence by scanning the bits of the FADDR value 126 into a scan chain formed by the bimodal latch components. This process of testing a memory storage location and then storing an address value for memory storage locations identified as faulty can be iterated for a portion or all of the memory storage locations of the memory array 104.

In some embodiments, the ADDR value 210 and the DATA_IN value 212 can be predetermined prior to testing, such as by writing to a corresponding register, by fusing the values, or by other techniques, for example, or the ADDR value 210 and the DATA_IN value 212 can be provided during testing via, e.g., the test port 106 as the SCAN_IN signal 140. Furthermore, in response to a stimulus indicating that a memory test mode is to be entered (e.g., via a signal provided by an external test device), the test generation module 202 places the BIST signal 136 in a first state (e.g., an asserted state), thereby configuring the logic die 100 in the memory device 1 in preparation for the memory test mode. Conversely, when the BIST/repair module 106 exits a memory test mode, the test generation module 202 places the BIST signal 136 in a second state (e.g., a de-asserted state) so as to configure the logic die 100 in the memory device 100 for normal operation. Likewise, when the test generation module 202 receives a stimulus indicating that an external test device is to utilize the scan chain formed by the bimodal latch elements 109-111, the test generation 202 can place the SCAN_EN signal 138 in an asserted state so as to configure the bimodal latch elements 109-111 to operate as elements of the scan chain.

Figure 4:
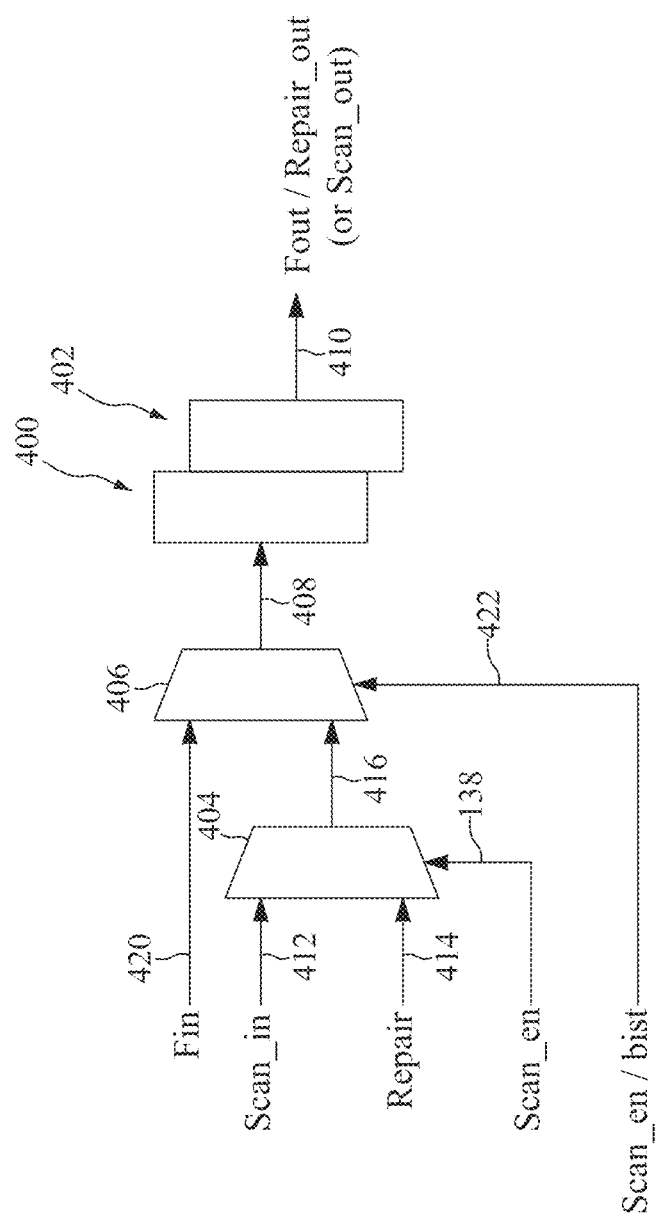
FIG. 4 is a block diagram of a bimodal latch element according to some embodiments of the present disclosure.

FIG. 4 is a block diagram of the bimodal latch element 400 according to some embodiments of the present disclosure. With reference to FIG. 4, the bimodal latch element 400 depicted represents one possible implementation of the bimodal latch elements 120-123 shown in FIG. 2, for example. As illustrated in FIG. 4, the bimodal latch element 400 includes a bit latch 402 (which may include any of a variety of clocked memory storage elements) and selection logic, such as a multiplexer 404 and a multiplexer 406. The bit latch 402 includes an input to receive a bit input signal 408 and an output to provide a latched bit signal 410, whereby the bit latch 402 is configured to latch the bit value of the bit input signal 408 for output as the latched bit value for the latched bit signal 410. In some embodiments, when in a functional mode, the latched bit signal 410 serves as the functional output (FOUT) for receipt by other functional circuitry. On the other hand, when in a memory test mode, the latched bit signal 410 serves as the input (REPAIR_OUT) to the next stage of a scan chain formed by a sequence of bimodal latch elements 400 for the sequential storage of bits representative of memory test/repair data (e.g., address values of faulty memory storage locations).

In some embodiments, the multiplexer 404 includes an input to receive a SCAN_IN signal 412, an input to receive a REPAIR signal 414, and an output to provide a select one of the SCAN_IN signal 412 or the REPAIR signal 414 as a non-functional data signal 416 based on the SCAN_EN signal 138. When the SCAN_EN signal 138 is in an asserted state to enable the scan chain of which the bimodal latch element 400 is a part, the multiplexer 404 provides the value of the SCAN_IN signal 412 as the non-functional data signal 416. Otherwise, the multiplexer 404 provides the value of the repair signal 414. In some embodiments, the SCAN_IN signal 412 may represent the SCAN_IN signal 140 of FIG. 2, either initially from the test port 106 or from another bimodal latch element prior in the scan chain. The REPAIR signal 414 may represent, when in a memory test mode, the memory test/repair data bit (e.g., a bit of a memory address of a faulty memory storage location) provided by the memory address storage module 206 for storage at the bimodal latch element 400.

In some embodiments, the multiplexer 406 includes an input to receive a functional data signal 420 from functional circuitry, an input to receive the non-functional data signal 416, and an output to provide a select one of the functional data signal 420 or the non-functional data signal 416 as the bit input signal 408 to the bit latch 402 based on a select signal 422. When the select signal 422 is in a first state (e.g., asserted state), the multiplexer 406 provides the value of the non-functional data signal 416 as the bit input signal 408. Otherwise, when the select signal 422 is in a second state (e.g., de-asserted state), the multiplexer 406 provides the value of the functional data signal 420 as the bit input signal 308. In some embodiments, the select signal 422 represents a logical OR operation between the BIST signal 136 and the SCAN_EN signal 138 (e.g., SCAN_EN∥BIST).

As depicted in FIG. 4, the multiplexers 404 and 406 operate as selection logic to select between functional data, scan chain data, and memory test/repair data (whereby the scan chain data can include memory test/repair data from another bimodal latch element when in scan chain mode). The multiplexer 404 operates to select between potential scan chain data (SCAN_IN signal 412) and potential memory test/repair data (REPAIR signal 414) depending on whether the bimodal latch elements 400 of the memory device 1 are enabled to enter a scan chain mode. Therefore, the output of the multiplexer 404 is non-functional data associated with memory test operations, rather than functional operations of the memory device 1. Further, the multiplexer 406 operates to select between functional data (i.e., from other functional circuitry) and the non-functional data (scan chain data or memory test/repair data) based on whether the memory device is in a scan chain enabled mode, a memory test mode (e.g., a built-in self-test mode), or a functional mode. Therefore, in a scan chain mode, as indicated by an asserted SCAN_IN signal 412, the multiplexers 404 and 406 select and provide the input scan chain data (which can include memory test/repair data) for storage at the bit latch 402. In a memory test mode, the multiplexers 404 and 406 select and provide the memory test/repair data (REPAIR signal 414) for storage at the bit latch 402. In a functional mode, the multiplexers 404 and 406 select and provide functional data for storage at the bit latch 402.

It should be appreciated that, although the depicted implementation shown in FIG. 4 facilitates the use of the bit latch 402 for storing both memory test/repair data and functional data, as well as operating as an element of a scan chain, this implementation does not introduce any additional delays into the functional path beyond those present in latches that enable scan chains. To illustrate, a conventional latch component typically would implement a multiplexer to select between scan chain data and functional data. Therefore, these conventional implementations introduce a delay due to this multiplexer. The implementation depicted in FIG. 4, like these conventional implementations, also has only one multiplexer delay in the functional path between the functional data signal 420 and the data latch 402. Accordingly, while the use of the multiplexer 404 in FIG. 4 to select between memory test/repair data and scan chain data may introduce two multiplexer delays during a memory test mode or a scan chain mode, it should also be appreciated that the two multiplexer delays occur in the non-functional data path, which typically is not as critical a path as the functional data path and thus does not significantly detract from acceptable operation of the memory device 1.

Figure 5:
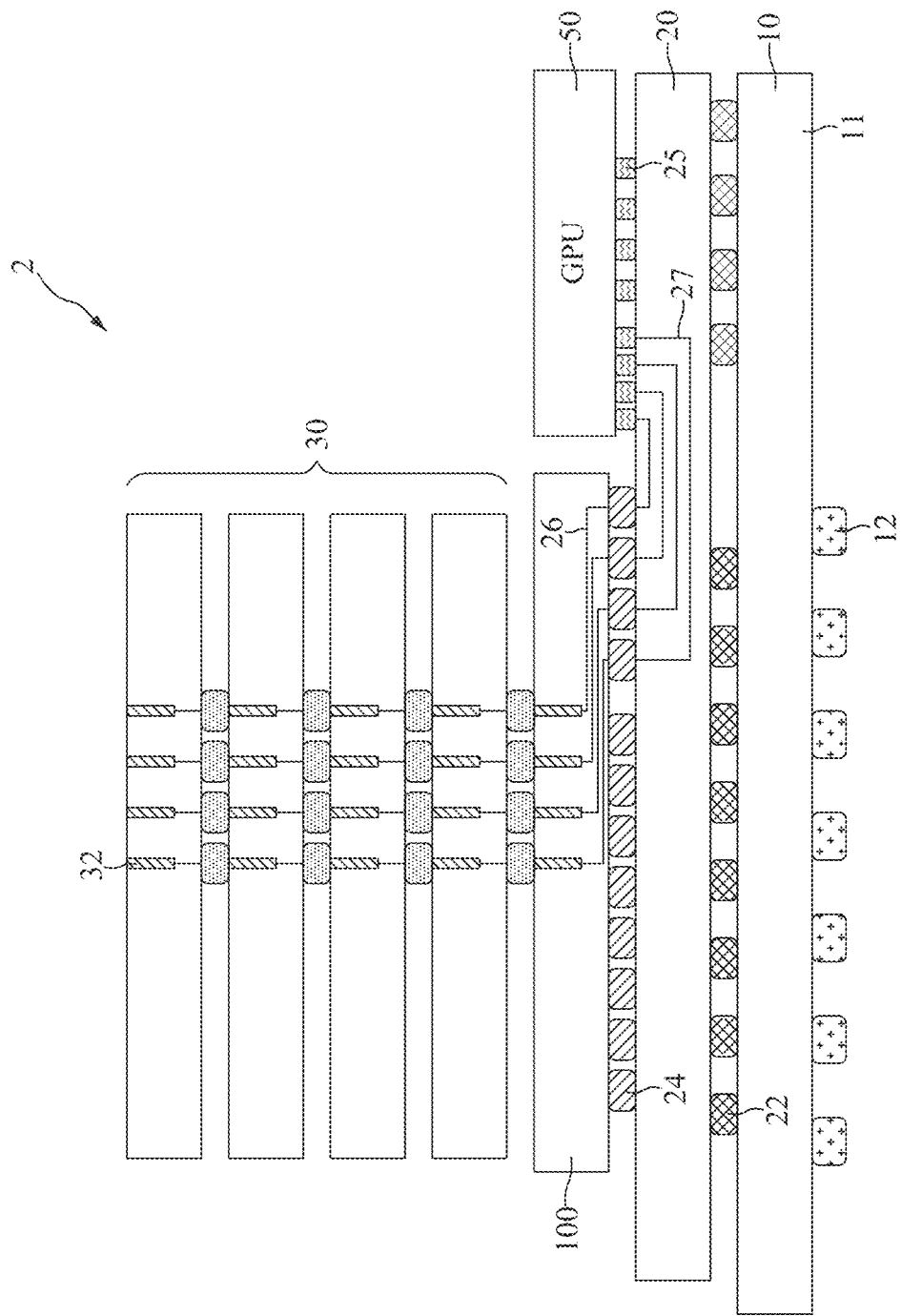
FIG. 5 is a schematic view of a logic die in a memory device according to some embodiments of the present disclosure.
Figure 6:
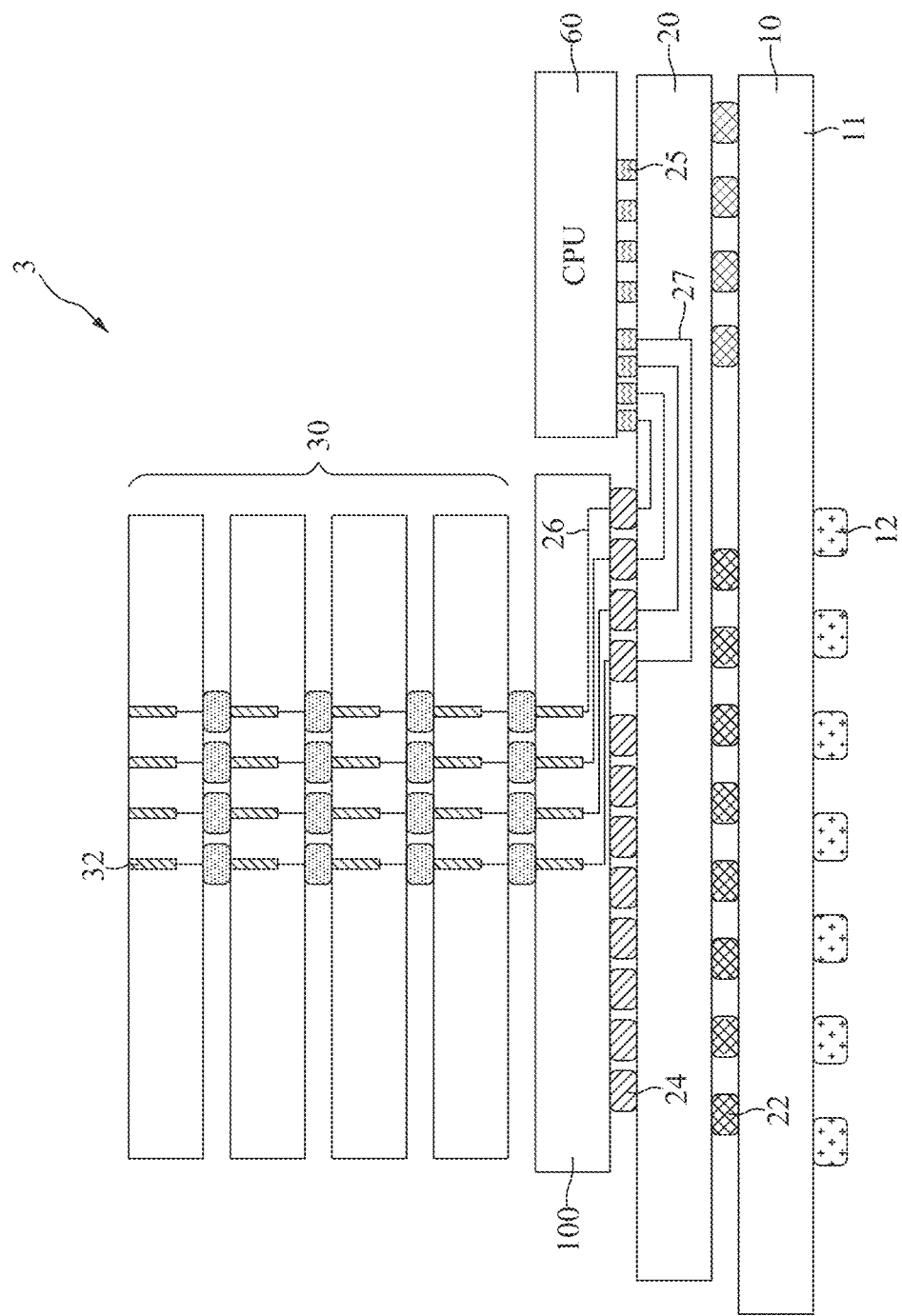
FIG. 6 is a schematic view of a logic die in a memory device according to some embodiments of the present disclosure.
Figure 7:
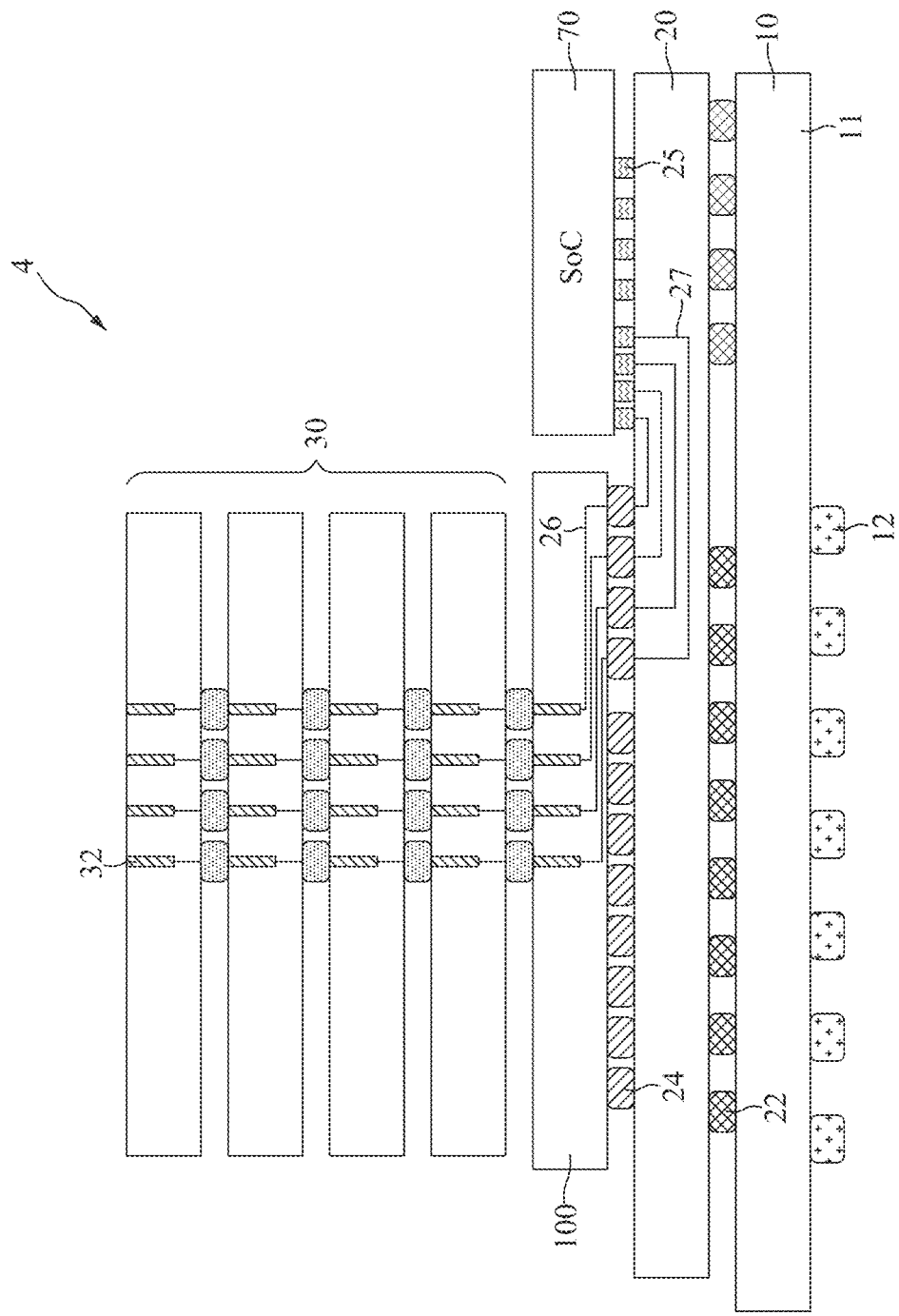
FIG. 7 is a schematic view of a logic die in a memory device according to some embodiments of the present disclosure.

It should be appreciated that, in some embodiments of the present disclosure, the logic die 100 of the 3D memory device 1 depicted in FIG. 1 may be connected to different devices disposed on another part of the same package as the memory device 1. FIG. 5 is a schematic view of the logic die 100 in a memory device 2 according to some embodiments of the present disclosure. With reference to FIG. 5, in the memory unit 2, a plurality of fourth microbumps 25 are disposed between a graphics processing unit (GPU) 50 and the interposer 20. As shown in FIG. 5, the GPU 50 resides in the same package as the memory device 2. A portion of the third microbumps 24 is connected to a portion of the fourth microbumps 25 via the traces 27, which may allow communication between the physical layer portions of the logic die 100 and the GPU 50, for example. FIG. 6 is a schematic view of the logic die 100 in a memory device 3 according to some embodiments of the present disclosure. With reference to FIG. 6, in the memory unit 3, a plurality of fourth microbumps 25 are disposed between a central processing unit (CPU) 60 and the interposer 20. As shown in FIG. 6, the CPU 60 resides in the same package as the memory device 3. A portion of the third microbumps 24 is connected to a portion of the fourth microbumps 25 via the traces 27, which may allow communication between the physical layer portions of the logic die 100 and the SoC 70, for example. It should be noted that, other types of devices not shown in FIG. 5 to FIG. 7 may be integrated in the same package with the 3D memory devices of the present disclosure, including active and passive devices, controllers, processing units, as well as application specific integrated circuits (ASICs). As shown in FIG. 5 to FIG. 7, since different types of devices can be integrated with the 3D memory devices in accordance with some embodiments of the present disclosure, the size of the entire package can be minimized while enjoying enhanced performance and product yield due to reduced transmission delays and the flexibility of the shared latch elements in the memory test/repair and functional operations of the logic die 100 in the memory devices 2-4. Moreover, the manufacturing costs of the 3D memory devices in the present disclosure should also be lower than the conventional memory architecture.

Figure 8:
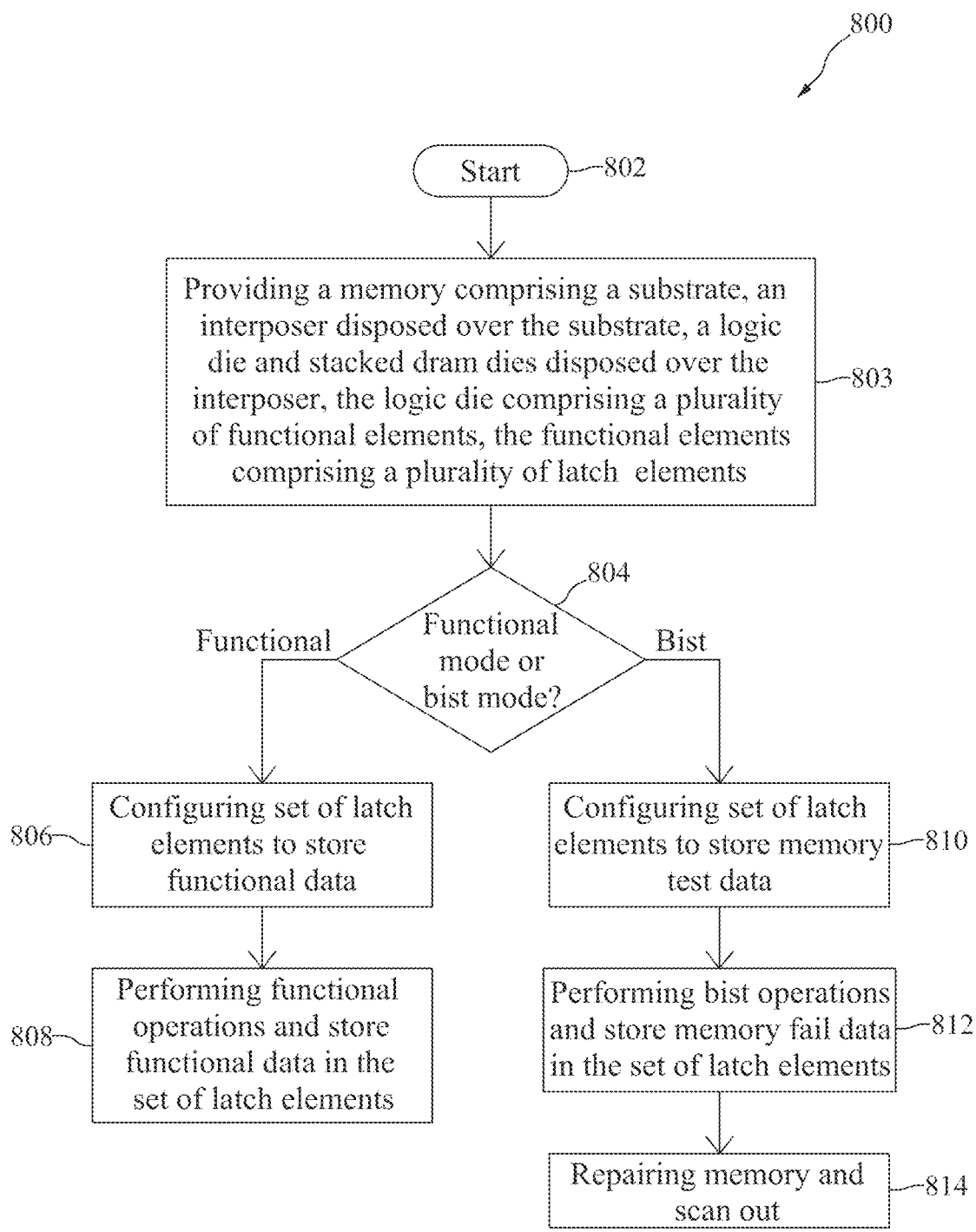
FIG. 8 is a flow diagram of a method for using shared latch elements in a memory device according to some embodiments of the present disclosure.

FIG. 8 is a flow diagram of a method 800 for using shared latch elements in the memory device 1 according to some embodiments of the present disclosure. With reference to FIG. 8, the method 800 uses a set of latch elements for both functional data and memory test/repair data. To facilitate discussion, the method 800 is described in the context of the memory device 1 depicted in FIG. 1 to FIG. 4. In some embodiments, the method 800 begins at block 802 and proceeds to Step 803 by providing the memory device 1 comprising the substrate 10, the interposer 20 disposed over the substrate 10, and the logic die 100 and the stacked DRAM dies 30 disposed over the interposer 20, in which the logic die 100 comprises the functional elements 109-111, and the functional elements 109-111 comprises the latch elements 120-123. The logic die 100 in the memory device 1 enters a mode of operation, and in Step 804, the mode of operation, functional mode or BIST mode, is identified. The mode may be identified based on signaling from an external test device, based on the status of a particular control bit, and the like. In the event that the mode of operation is identified as a functional mode, at Step 806, the set of latch elements (e.g., bimodal latch elements 120-123) are configured to store functional data (e.g., by de-asserting the BIST signal 136 and the SCAN_EN signal 138). At Step 808, one or more functional operations are performed at the logic die 100 in the memory device 1, and functional data generated as a result of these functional operations is stored in the set of latch elements 120-123.

In the event that the mode of operation is identified as a memory test mode (e.g., a BIST mode to determine and store memory test/repair data or a scan chain mode to scan out the memory test/repair data), at Step 810, the set of latch elements (e.g., bimodal latch elements 120-123) are configured to store memory test/repair data (e.g., by asserting the BIST signal 136 and de-asserting the SCAN_EN signal 138). At Step 812, one or more memory test operations are performed at the logic die 100 in the memory device 1, and the memory test/repair data (e.g., address values of faulty memory storage locations) generated as a result of these memory test operations is stored in the set of latch elements 120-123, in parallel. The memory test/repair data comprises a series of bits representing a serial list of memory addresses of faulty memory storage locations of the memory device that are identified during the memory test operations. At Step 814, the memory device 1 can be repaired by rerouting memory addresses from the faulty memory storage locations identified in the stored memory test/repair data to alternate memory storage locations. Moreover, at Step 814, the SCAN_EN signal 136 can be asserted, thereby enabling the set of latch elements to be used as a scan chain, and an external test device can scan out the memory test/repair data from the set of latch elements 120-123 via the test port 106.

Figure 9:
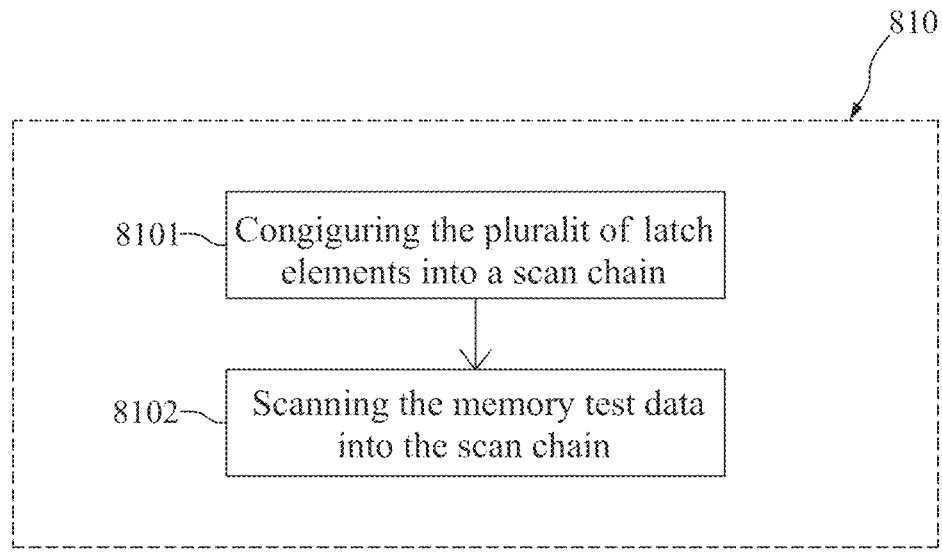
FIG. 9 is a flow diagram of a step in a method for using shared latch elements in a memory device according to some embodiments of the present disclosure.

FIG. 9 is a flow diagram of Step 810 in the method 800 for using shared latch elements in the memory device 1 according to some embodiments of the present disclosure. With reference to FIG. 9, in some embodiments, Step 810 may further include configuring the latch elements (e.g., bimodal latch elements 120-123) into a scan chain (Step 8101), such as by asserting the BIST signal 136 and de-asserting the SCAN_EN signal 138. Moreover, Step 810 may further include scanning the memory test/repair data into the scan chain (Step 8102).

Figure 10:
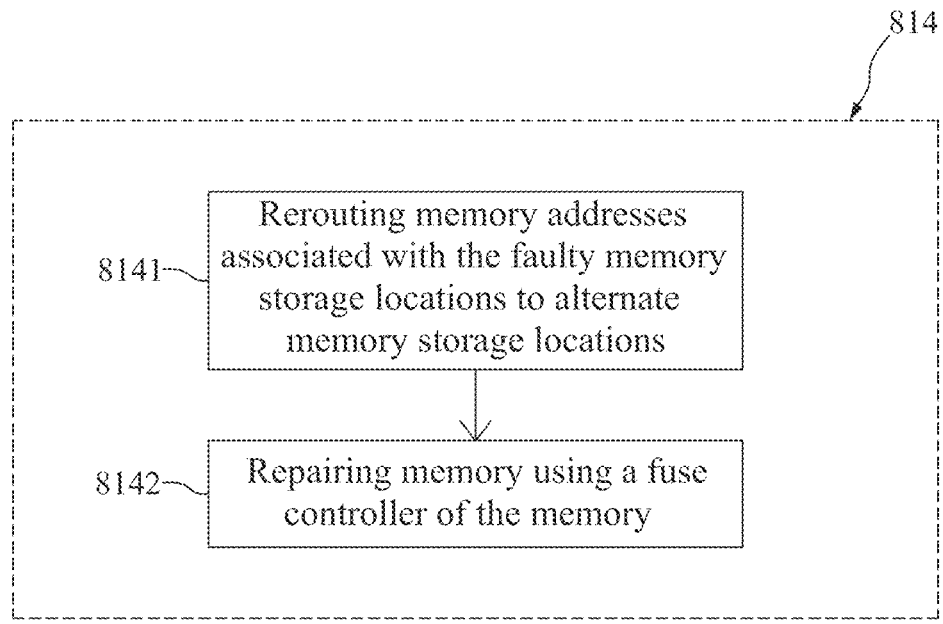
FIG. 10 is a flow diagram of a step in a method for using shared latch elements in a memory device according to some embodiments of the present disclosure.

FIG. 10 is a flow diagram of Step 814 in the method 800 for using shared latch elements in the memory device 1 according to some embodiments of the present disclosure. With reference to FIG. 10, in some embodiments, Step 814 may further include rerouting memory addresses associated with the faulty memory storage locations to alternate memory storage locations (Step 8141). Moreover, Step 814 may further include repairing the memory device 1 using a fuse controller (e.g., fuse controller 108) of the logic die 100 in the memory device 1 (Step 8142).

Accordingly, the 3D memory devices and the methods of the present disclosure utilize bimodal shared latch elements to store either memory test/repair data related to a memory test operation or functional data related to a functional operation, depending on a mode of the memory device. Thus, latch elements used for functional operations that would otherwise be idle during memory test operations can be reused for memory test operations, and also vice versa, thus requiring fewer latch elements than a conventional memory architecture having latches dedicated to storing only memory test information. Moreover, the size of the entire package can be further minimized with device integration, and therefore the 3D memory devices and the methods of the present disclosure have enhanced performance and product yield due to reduced transmission delays and the flexibility of the shared latch elements in the memory test/repair and functional operations of the logic dies in the 3D memory devices. Moreover, the manufacturing costs of the 3D memory devices in the present disclosure should also be lower than the conventional memory architecture.

One aspect of the present disclosure provides a memory device, comprising a substrate, an interposer disposed over the substrate, a logic die disposed over the interposer, and a plurality of stacked dynamic random access memory (DRAM) dies disposed over the interposer. The logic die comprises a test generation module, a plurality of functional elements, a repair analysis module, and a memory address storage module. The test generation module performs a memory test operation for the memory device. The plurality of functional elements comprises a plurality of latch elements, and the plurality of functional elements stores functional data in the plurality of latch elements during a functional mode of the memory device. The repair analysis module determines memory test/repair data based on the memory test operation. The memory test/repair data comprises a series of bits representing a serial list of memory addresses of faulty memory storage locations of the memory device that are identified during the memory test operation. The memory address storage module stores the memory test/repair data at the plurality of latch elements during a test mode of the memory device. The memory address storage module comprises a plurality of outputs, each output mapped to an input of a corresponding latch element. Moreover, the memory address storage module stores the memory test/repair data by storing, in parallel, each bit of the memory test/repair data to a corresponding latch element via a corresponding output of the plurality of outputs. The repair analysis module configures the plurality of latch elements into a scan chain, uses the scan chain to access the memory test/repair data during the test mode of the memory device, and repairs the memory device using the memory test/repair data accessed from the scan chain.

Another aspect of the present disclosure provides a method, comprising: providing a memory device comprising a substrate, an interposer disposed over the substrate, and a logic die and a plurality of stacked dynamic random access memory (DRAM) dies disposed over the interposer, the logic die comprising a plurality of functional elements, the plurality of functional elements comprising a plurality of latch elements; in a first mode, performing one or more functional operations using the functional elements and storing functional data associated with the one or more functional operations at the plurality of latch elements; in a second mode: performing a memory test operation for the memory device to determine memory test/repair data, the memory test/repair data comprising a series of bits representing a serial list of memory addresses of faulty memory storage locations of the memory device that are identified during the memory test operation; and storing, in parallel, each bit of the memory test/repair data at a corresponding latch element of the plurality of latch elements; configuring the plurality of latch elements into a scan chain and using the scan chain to access the memory test/repair data; and repairing the memory device using the memory test/repair data accessed from the scan chain.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A memory device, comprising:
a substrate;
an interposer disposed over the substrate;
a logic die disposed over the interposer; and
a plurality of stacked memory dies disposed over the interposer;
wherein the logic die comprises:
a test generation module to perform a memory test operation for the memory device, wherein the test generation module of the logic die is connected to the plurality of stacked memory dies disposed over the logic die;
a plurality of functional elements comprising a plurality of latch elements, the plurality of functional elements storing functional data in the plurality of latch elements during a functional mode of the memory device;
a repair analysis module to determine memory test/repair data based on the memory test operation, the memory test/repair data comprising a series of bits representing a serial list of memory addresses of faulty memory storage locations of the memory device that are identified during the memory test operation; and
a memory address storage module to store the memory test/repair data at the plurality of latch elements during a test mode of the memory device, the memory address storage module comprising a plurality of outputs, each output mapped to an input of a corresponding latch element, and wherein the memory address storage module stores the memory test/repair data by storing, in parallel, each bit of the memory test/repair data to a corresponding latch element via a corresponding output of the plurality of outputs;
wherein the repair analysis module further configures the plurality of latch elements into a scan chain, uses the scan chain to access the memory test/repair data during the test mode of the memory device, and repairs the memory device using the memory test/repair data accessed from the scan chain.

2. The memory device of claim 1, further comprising a memory array to route memory addresses associated with the faulty memory storage locations to alternate memory storage locations.

3. The memory device of claim 2, further comprising:
an external test port coupled to the plurality of latch elements, wherein the memory device configures the plurality of latch elements into a scan chain and scan out the memory test/repair data to an external device via the external test port.

4. The memory device of claim 2, further comprising:
a fuse controller, wherein the memory array reroutes the memory addresses associated with the faulty memory storage locations further based on fuse states of the fuse controller.

5. The memory device of claim 1, wherein the memory address storage module stores the memory test/repair data by configuring the plurality of latch elements into the scan chain and scanning the memory test/repair data into the scan chain.

6. The memory device of claim 1, wherein each latch element of the plurality of latch elements comprises:
a first input configured to receive a corresponding functional data bit of the functional data;
a second input configured to receive a corresponding memory test/repair data bit of the memory test/repair data;
a latch comprising a data input and a data output; and
select logic configured to selectively connect one of the first input or the second input to the data input of the latch based on a mode of operation of the memory device.

7. The memory device of claim 6, wherein the plurality of latch elements is configurable into a scan chain, and wherein each latch element of a subset of the plurality of latch elements further comprises:
a third input coupled to the data output of the latch of a previous latch element in the scan chain; and
wherein the select logic is configured to selectively connect one of the first input, the second input, or the third input to the data input of the latch based on the mode of operation of the memory device.

8. The memory device of claim 7, wherein the select logic comprises:
a first multiplexer comprising an input configured to receive a first control signal, an input coupled to the second input, an input coupled to the third input, and an output; and
a second multiplexer comprising an input configured to receive a second control signal, an input coupled to the output of the first multiplexer, an input coupled to the first input, and an output coupled to the data input of the latch.

9. The memory device of claim 8, wherein:
the first control signal is based on a state of the scan chain; and
the second control signal is based on the state of the scan chain and the mode of operation of the memory device.

10. The memory device of claim 6, wherein the select logic comprises:
a multiplexer comprising an input configured to receive a control signal, an input coupled to the first input, an input coupled to the second input, and an output.

11. A method, comprising:
providing a memory device comprising a substrate, an interposer disposed over the substrate, and a logic die and a plurality of stacked memory dies disposed over the interposer, the logic die comprising a plurality of functional elements, the plurality of functional elements comprising a plurality of latch elements;

in a first mode, performing one or more functional operations using the functional elements and storing functional data associated with the one or more functional operations at the plurality of latch elements;

in a second mode:
performing a memory test operation for the memory device, by a test generation module in the logic die connected to the plurality of stacked memory dies disposed over the logic die, to determine memory test/repair data, the memory test/repair data comprising a series of bits representing a serial list of memory addresses of faulty memory storage locations of the memory device that are identified during the memory test operation; and storing, in parallel, each bit of the memory test/repair data at a corresponding latch element of the plurality of latch elements;

configuring the plurality of latch elements into a scan chain and using the scan chain to access the memory test/repair data; and repairing the memory device using the memory test/repair data accessed from the scan chain.

12. The method of claim 11, wherein repairing the memory device using the memory test/repair data comprises rerouting memory addresses associated with the faulty memory storage locations to alternate memory storage locations.

13. The method of claim 12, wherein repairing the memory device further comprises repairing the memory device using a fuse controller of the memory device.

14. The method of claim 11, further comprising:
configuring the plurality of latch elements into a scan chain and scanning out the memory test/repair data to an external device via an external test port of the memory device.

15. The method of claim 11, wherein storing the memory test/repair data at the plurality of latch elements comprises:
configuring the plurality of latch elements into a scan chain; and
scanning the memory test/repair data into the scan chain.

16. The method of claim 11, wherein storing the memory test/repair data at the plurality of latch elements comprises configuring the plurality of latch elements to store the memory test/repair data in response to a control signal having a first state.

17. The method of claim 16, wherein storing the functional data at the plurality of latch elements comprises configuring the plurality of latch elements to store the functional data in response to the control signal having a second state.

18. The method of claim 11, further comprising:
accessing the memory test/repair data from the plurality of latch elements via an external test port.

* * * * *